4,003,632

United States

Komiya et al.

Jan. 18, 1977

[54] OPTOELECTRONIC SEMICONDUCTOR DEVICE

[75] Inventors: Yoshio Komiya; Eiichi Suzuki, both of Tanashi; Yasuo Tarui, Higashi-Kurume, all of Japan

[73] Assignee: Agency of Industrial Science & Technology, Tokyo, Japan

[22] Filed: Mar. 26, 1975

[21] Appl. No.: 562,134

[30] Foreign Application Priority Data

Apr. 3, 1974  Japan .............................. 49-36888

[52] U.S. Cl. .................... 350/160 R; 350/96 WG; 357/17
[51] Int. Cl.[2] ...................... G02F 1/20; G02B 5/14; H01L 33/00
[58] Field of Search ......... 350/160 R, 96 WG, 161; 340/173 LS; 357/17

[56] References Cited

UNITED STATES PATENTS

| | | | |
|---|---|---|---|
| 3,855,583 | 12/1974 | Gudmundsen | 340/173 LS |
| 3,860,916 | 1/1975 | Tarui et al. | 340/173 LS |
| 3,904,270 | 9/1975 | Cheo | 350/96 WG |

OTHER PUBLICATIONS

Hensler, D. H., et al. "Optical Propagation in Sheet and Pattern Generated Films of $Ta_2O_5$," Appl. Optics, vol. 10, No. 5, May 1971, pp. 1037–1042.
Ostrowsky D. B. et al. "Integrated Optical Photodetector," Appl. Phys. Lett., vol. 22, No. 9, May 1973, pp. 463–464.

Primary Examiner—John K. Corbin
Assistant Examiner—Rolf Hille
Attorney, Agent, or Firm—Oblon, Fisher, Spivak, McClelland & Maier

[57] ABSTRACT

Disclosed is an optoelectronic semiconductor comprising a semiconductor substrate, a first insulating film covering the major surface of the semiconductor substrate and a second insulating film having electronic charge-storing means and lying on the first insulating film. When an optically guided wave is propagated to the first or second insulating film in the direction parallel to the major surface of the semiconductor substrate, an interaction is caused between the electronic charges stored in the charge-storing means and the optically guided wave, thereby allowing the optically guided wave to be modulated and the electronic charges to be released.

12 Claims, 9 Drawing Figures

OPTOELECTRONIC SEMICONDUCTOR DEVICE

BACKGROUND OF THE INVENTION

This invention relates generally to an optoelectronic semiconductor device, and more particularly to an optoelectronic semiconductor having therein memory elements which are responsive to injected light for erasing memory and/or for modulating injected light.

Along with the development of the optical information processing technique, there has arisen an ever increasing demand for miniaturization of the space-consuming optical system.

In solving this technical problem, it is required that an optical device be integrally combined with a semiconductor device produced by semiconductor integrated circuit technology.

Also, for providing an optoelectronic semiconductor device having new capabilities, it is required that the optical devices be combined with semiconductor devices as an organic whole. The optical modulator which has been hitherto used, however, is of single crystal using electro-optic effect to cause modulation, and it is difficult for this material to mate with the conventional semiconductor device. As for the optical waveguide which has been hetherto used in propagation of light, a thin film whose refractive index is higher than that of a glass substrate is deposited on the substrate to function as an optical waveguide.

Otherwise, an organic solid insulating material which is essentially transparent to the light is fitted to same substrate to construct the optical waveguide, or the high index-of refraction region of a layered compound semiconductor device such as a GaAs or $Ga_xAl_{1-x}As$ is used as the waveguide.

Some of such materials, however, are difficult to treat electrically, and others are not amenable to batch production.

It is most desirable to combine an optical device with an integrated circuit on an Si substrate according to the integrated circuit manufacturing processes. It is desired to build an optical device directed to a particular purpose into an electric integrated circuit on one and the same substrate. Therefore, the first object of this invention is to provide an optical modulator which can be easily made by combining an optical waveguide and a semiconductor device on an Si substrate so as to constitute an organic whole according to the integrated circuit technology.

The second object of this invention is to provide an optoelectronic semiconductor device which is an integral combination of waveguide and semiconductor memory on one and the same substrate, and is capable of controlling the threshold gate voltage value of the semiconductor MIS memory in response to the guided light.

The third object of this invention is to provide an optoelectronic semiconductor device using its semiconductor film per se as an optical waveguide which device is capable of modulating the light through the interaction between the guided light and the stored electronic charges or local semiconductor surface charges due to the stored memory charge.

SUMMARY OF THE INVENTION

To attain the objects above mentioned an optoelectronic semiconductor device according to this invention comprises a semiconductor substrate; a first insulating layer covering the major surface of said semiconductor substrate; a second insulating layer formed on said first insulating layer, said second insulating layer having electronic charge storing means; and light-introducing means provided on said first insulating layer, on said second insulating layer or on the semiconductor substrate, said layer or substrate forming optical waveguide. With this arrangement, electronic charges which are stored in the memory means, are discharged by the interaction between the so-stored electronic charges and the light propagating in the optical waveguide in the direction parallel to the major surface of the semiconductor substrate. Thus, the memory is erased if the optoelectronic semiconductor device according to this invention is used as a memory element, and the guide light is modulated (or deflected in the propagating direction) by the so-stored charges if the optoelectronic semiconductor device is used as an optical modulator.

Because of the structural simplicity in the optoelectronic semiconductor device of this invention, it can be easily manufactured according to semiconductor integrated circuit technology, and can also be easily made in the form of an integrated circuit.

These and other objects and advantages of this invention will be better understood from the following description which is made with reference to the drawings:

BRIEF DESCRIPTION OF THE DRAWINGS

FIG. 1(A) is a plan view showing the structure of one embodiment of this invention whereas

DETAILED EXPLANATION OF THE INVENTION

Figure 1A:
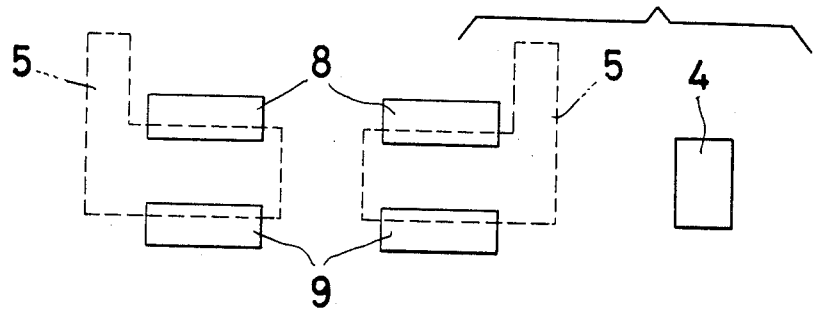

A plate of Si or other semiconductor material is prepared using integrated circuit technology. The major surface of the so-prepared semiconductor plate is covered with an insulating layer of a material that passes light with no essential loss. An optical waveguide is formed on the insulating layer. The overlying optical waveguide is of a material having a higher index of refraction than that of the first insulating layer, and the waveguide has local electronic charge-storing means.

Light wave in the waveguide mode can be considered as a plane wave which propagates along a zigzag path in the waveguide by internal total reflection. The field of the light continues into an exponentially decreasing function below the base of the waveguide and above the top of the waveguide. The part of the field that extends below the waveguide base and above the waveguide top is called the evanescent field.

The first layer of insulating film lying under the optical waveguide functions as a spacer to prevent the propagating light in the waveguide from leaking to the semiconductor substrate through evanescent waves.

The guided mode of the light is determined by the index of refraction of the material of the waveguide, the refractive indices of the materials adjacent to the waveguide, and the angle between the waveguide interface and the wave number vector in the waveguide. Therefore, if some arrangement is provided for changing either the index of refraction of the waveguide material or that of the adjacent material, mode or amplitude modulation of the guided light can be performed. As mentioned earlier, some conventional optical modulators use the electro-optical effect, and such modulators are made of a single crystal. Therefore, it is very difficult to build such a single crystal optical modulator in an integrated circuit structure. This invention uses the interaction between the guided light in the waveguide and the electronic charges stored locally in the waveguide. The interaction therebetween is, in fact, equivalent to the change of the index of refraction of the waveguide material at a place where the interaction occurs, and mode or amplitude modulation of the light results. If no electronic charges are stored in the electronic charge-storing means in the waveguide, no interaction and hence no modulation results. The semiconductor substrate per se can be used as an optical waveguide for the light whose energy is below the energy corresponding to the energy gap of the semiconductor substance of the substrate. In this case interaction can be obtained between the guided wave and the stored electronic charges through the evanescent wave or as a result of the local semiconductor surface charge generated by the stored charge.

It is possible to erase the memory written in the form of electronic charges stored in the electronic charge-storing means in the waveguide by exciting and discharging the so-stored electronic charges by the light propagating in the waveguide. Thus, the memory stored in the memory element built on the semiconductor substrate, can be erased by the guided light. Also, it is possible to write information into the memory by exciting the electronic charges in the gate electrodes by means of the evanescent wave of the guided light and by injecting the so-excited electronic charges from the gate electrodes of the semiconductor memory element to associated electronic charge-storing means.

Preferred embodiments of this invention are described hereinafter with reference to the accompanying drawings.

Figure 1B:
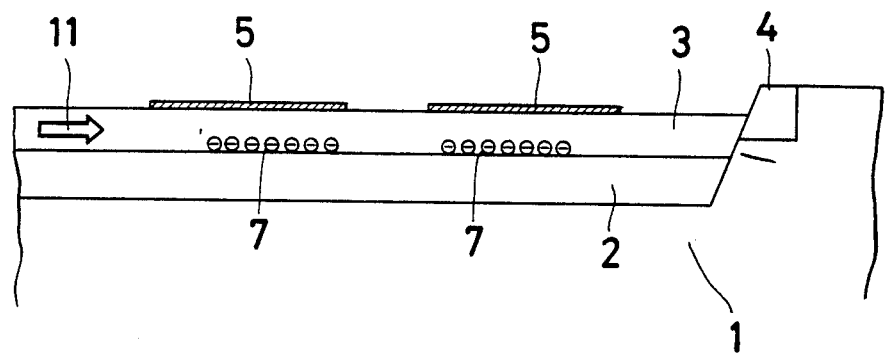
FIG. 1(B) is a sectional view of the embodiment showing traps acting as electronic charge-storing means in the optical waveguide.

Referring to FIGS. 1(A) and 1(B), an $SiO_2$ layer (insulating layer) 2 is formed on an Si substrate 1 by oxidizing the Si substrate.

A $Ta_2O_5$ or an $Al_2O_3$ layer 3 is deposited on the so-formed insulating layer.

The index of refraction of $SiO_2$ is about 1.45. The index of refraction of $Ta_2O_5$ ranges from 2.1 to 2.2, and that of $Al_2O_3$ ranges from 1.6 to 1.8.

Owing to this difference the $Ta_2O_5$ layer, $Al_2O_3$ layer on $SiO_2$ layer can act as an optical wave guide.

Optical waveguide modes of a $Ta_2O_5$ thin film can be obtained by means of the following formulas.

$$2b_1 W - 2\Phi_{10} - 2\Phi_{12} = 2m\pi \quad (m = 0, 1, ) \quad (1)$$

$$\tan\Phi_{10} = \begin{cases} (n_1^2\sin^2\theta_1 - n_0^2)^{1/2}/(n_1\cos\theta_1) \text{ for TE} \\ n_1^2(n_1^2\sin^2\theta_1 - n_0^2)^{1/2}/(n_0^2 n_1\cos\theta_1) \text{ for TM} \end{cases} \quad (2)$$

$$\tan\Phi_{12} = \begin{cases} (n_1^2\sin^2\theta_1 - n_2^2)^{1/2}/(n_1\cos\theta_1) \text{ for TE} \\ n_1^2(n_1^2\sin^2\theta_1 - n_2^2)^{1/2}/(n_2^2 n_1\cos\theta_1) \text{ for TM} \end{cases} \quad (3)$$

$$b_1 = kn_1\cos\theta_1$$

Figure 2:
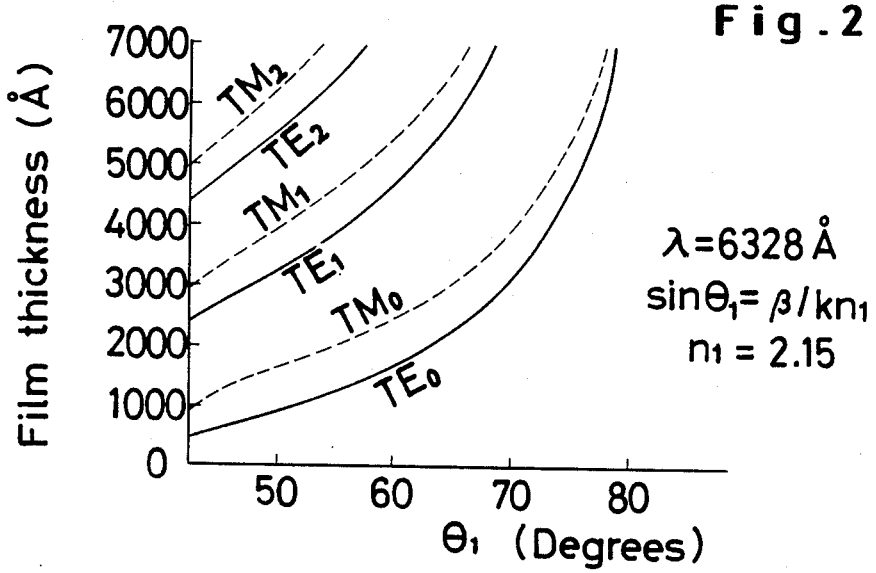
FIG. 2 shows the optical waveguide modes of a $Ta_2O_5$ thin film on the oxidized silicon wafer.

Here, $n_0$, $n_1$, and $n_2$ are the refractive indices of a $SiO_2$, a $Ta_2O_5$, and air respectively, $\theta_1$ is the angle measured between the light path and the normal of the interface in the film, W is thickness of a $Ta_2O_5$ film and k is wave number of the light in vacuum. And $m=0, 1, 2, \ldots$, is the order of the mode. FIG. 2 shows the optical waveguide modes of a $Ta_2O_5$ thin film on the oxidized silicon wafer, where it is assumed that the leakage of the guided light to a silicon substrate is negligible and the refractive indices of a $Ta_2O_5$ film and a $SiO_2$ film are 2.15 and 1.46 respectively.

The insulating layer 2 serves to prevent the light propagating in the layer 3 from leaking to the Si substrate 1 through the evanescent wave.

Figure 3:
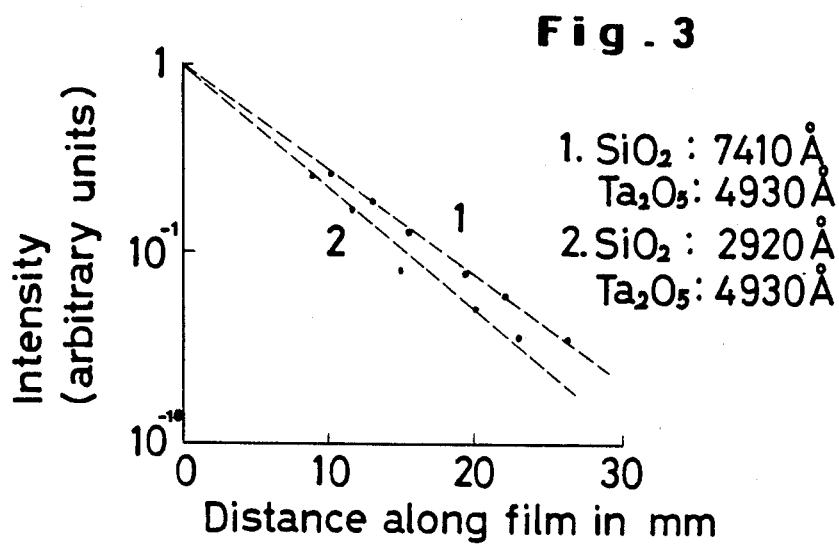
FIG. 3 shows the propagation loss of guided light from a He-Ne laser (wave length $\lambda = 6328$ A) in $Ta_2O_5$ films on a thermally oxidized silicon substrate.

FIG. 3 shows the propagation of light from a He-Ne laser ($\lambda=6328$ A) in a $Ta_2O_5$ films on a thermally oxidized silicon substrate, measured by using rutile prism couplers in the $TM_1$ mode. The transmission loss due to scattering and absorption is about 5.6 dB/cm from the curve 1 (thickness of $SiO_2$:7410 A), where the leakage of the guided light to a silicon substrate is theoretically negligible. In the case of the sample with the thin $SiO_2$ layer, the leakage loss should be considered in addition to the scattering and absorption loss.

The light power propagating in a leaky waveguide can be calculated by the following.

$$P(x) = P(O)\exp(-2Sx) \quad (5)$$

$$S = e^{-2P_0 d}\sin 2\Phi_{10}\sin 2\Phi_{30}/(W\tan\theta_1) \quad (6)$$

$$P_0^2 = (kn_1\sin\theta_1)^2 - (kn_0)^2 \quad (7)$$

$$P_0^2 = (kn_1\sin\theta_1)^2 - (kn_0)^2 \quad (7)$$

$$\tan\Phi_{30} = \begin{cases} (n_3^2\sin^2\theta_3 - n_0^2)^{1/2}/(n_3\cos\theta_3) \text{ for TE} \\ n_3^2(n_3^2\sin^2\theta_3 - n_0^2)^{1/2}/(n_0^2 n_3\cos\theta_3) \text{ for TM} \end{cases} \quad (8)$$

, where $d$ is the thickness of the $SiO_2$ layer, W is given by eq. (1), and $n_3$, $\theta_3$ are the refractive index of silicon and the angle measured between the light path and the normal of the interface in the Si substrate. Curve 2 (thickness of $SiO_2$:2920 A) indicates 6.7 dB/cm in loss. The leakage loss of 1.1 dB/cm in this case is found to be in accordance with the theoretical estimation from eq. (5). Consequently, an insulating layer 2 with adequate thickness is required to prevent the light propagating in the layer 3 from leaking to the Si substrate 1.

As is well known, a $Ta_2O_5$ or an $Al_2O_3$ film has, by nature, some electron traps. If the electrons 7 in the electron traps are exposed to a light of an energy which is larger than that which corresponds to the energy level depth of the traps, the electrons will be released from the traps. The excitation of the trapped electrons accompanies the absorption of the light. When the light 11 propagates in the layer 3, and when the light passes through each of the traps, it will bring about the release of the electrons stored in the traps, thus erasing the memory stored in the form of trapped electrons.

As shown in FIG. 1(A), an MTOS (Metal-Ta$_2$O$_5$-SiO$_2$-Si) transistor or MAOS (Metal-Al$_2$O$_3$-SiO$_2$-Semiconductor) transistor is formed by providing source electrodes 8 and drain electrodes 9 in the vicinity of the surface of the Si substrate 1, and the threshold voltage of the transistor becomes variable. The injection of electrons from the Si substrate 1 to the Ta$_2$O$_5$ layer is carried out, for instance, by exposing the transparent gate electrodes 5 to ultraviolet rays, by making use of avalanche process near the Si surface applying large voltage between the substrate 1 and the source electrodes 8 or between the substrate 1 and the drain electrodes 9, where the gate is properly biased, or by exposing the transparent gate electrodes to visible rays at a relatively high voltage below which an avalanche process will take place.

If the electrons in the electrodes 5 are excited by the evanescent wave of the guided light propagating under the electrodes, and if the energy of the so-excited electrons is over the barrier height between the Ta$_2$O$_5$ and the electrode, electrons can be injected and stored from the gate electrodes into the charge storing means for the memory element by applying a proper bias voltage to the gate electrodes.

A PN photo-diode 4 is built on the same substrate. The photo-diode is used to detect the light 11 after it has passed through the electron traps in the Ta$_2$O$_5$ layer 3. The gate electrode 5 is used to constitute a part of an MIS transistor or an MIS diode. The electrode has a substantial influence on the guided light propagating in the waveguide. If the gate electrode is made of a transparent, electrically conductive film of a material whose index of refraction is less than that of the Ta$_2$O$_5$, or if it is tapered along the periphery thereof, the gate electrode can be continuously connected with the surrounding part of the device.

Figure 4:
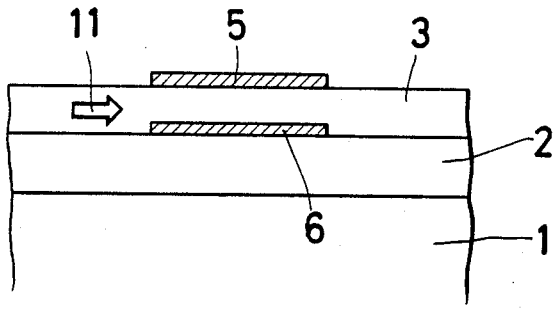
FIGS. 4 and 5 show other embodiments of this invention using floating gates as electronic charge-storing means.
Figure 5:
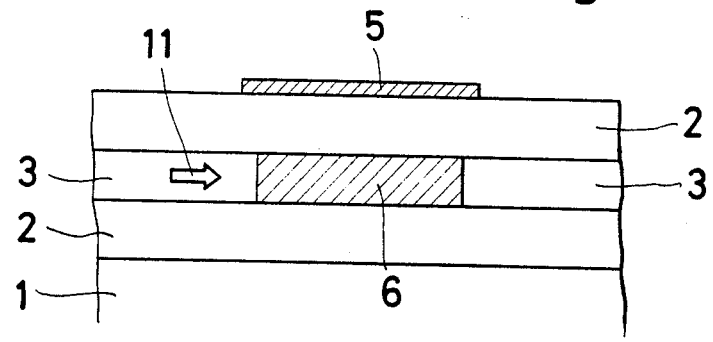

FIGS. 1(A) and 1 (B) show one embodiment of this invention in which a Ta$_2$O$_5$ layer 3 is used as an optical waveguide and some parts of the layer are, by nature, capable of storing electrons. FIGS. 4 and 5 show other embodiments in which electronic charge-storing means are built in an optical waveguide in the form of floating gates. In FIG. 4, a floating gate 6 is formed by embedding an electric conductive material such as poly-Si, ZnO$_2$ or In$_2$O$_3$, in the optical guide wave of Ta$_2$O$_5$ layer 3. The gate electrode 5 just above the underlying floating gate 6 in the Ta$_2$O$_5$ layer 3 is used to store electronic charges, so that the modulation of light and the erasure of memory is performed through the interaction between the so-stored electronic charges and the guided light.

Referring to FIG. 5, a Ta$_2$O$_5$ layer 3 is partly removed, and a floating gate 6 is formed by filling the remaining space with an electric conductive and light transparent material such as SnO$_2$, In$_2$O$_3$ etc. An SiO$_2$ layer 2 is deposited on the so-modified Ta$_2$O$_5$, and a gate electrode 5 is fixed to the SiO$_2$ layer 2, lying over the floating gate 6. The index of refraction of SiO$_2$ is less than that of Ta$_2$O$_5$, and therefore with this arrangement the Ta$_2$O$_5$ layer 3 is used as an optical waveguide. This embodiment functions in the same way as the embodiment of FIG. 4.

In FIGS. 4 and 5, light 11 propagates in the optical waveguide. In the arrangement shown in FIGS. 4 and 5, the electronic charge-storing means can be embodied in the waveguide in the form of a floating gate, even if the waveguide material itself has no electronic charge-storing means.

Figure 6:
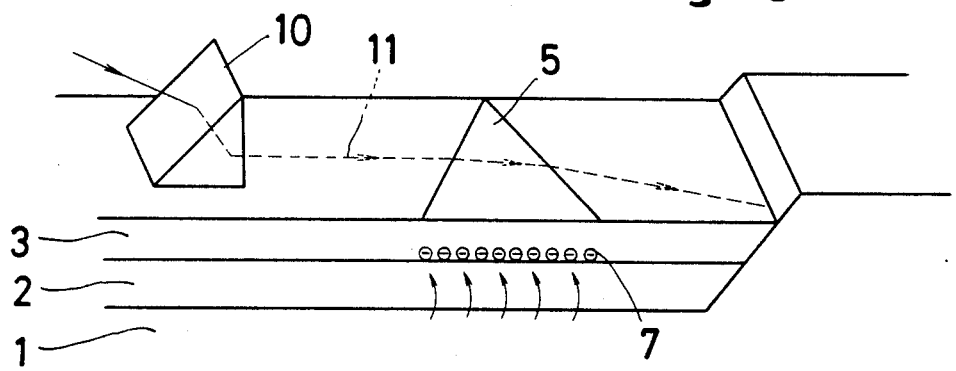
FIG. 6 shows still another embodiment of this invention using a gate in the form of plane triangular prism.

Referring to FIG. 6, there is shown a structure according to this invention by which modulation of light is carried out. An SiO$_2$ layer 2 is formed on an Si substrate 1, and finally a Ta$_2$O$_5$ layer 3 is laid on the SiO$_2$ layer 2. The Ta$_2$O$_5$ layer 3 constitutes an optical waveguide as is the case of FIGS. 1(A) and 1(B). A positive bias voltage is applied to the transparent gate electrode 5, and electrons are injected into the Ta$_2$O$_5$ layer 3 by means of ultraviolet rays. The transparent gate electrode 5 is in triangular form, and electrons are injected and stored in the part of the Ta$_2$O$_5$ layer 3 lying under the triangular gate electrode 5. When the light propagating in the Ta$_2$O$_5$ layer reaches the triangular part where the electrons are trapped, a part of the light is absorbed, and at the same time the electrons are released from the traps. The mode of the guided light is influenced when the guided light passes through the triangular area in the optical waveguide.

In fact, the phase velocity of the guided light in the area of the Ta$_2$O$_5$ layer lying under the gate electrode 5 is different from the phase velocity of the guided light passing through the other part of the optical waveguide, thus attaining the same effect as would be caused if the index of refraction of the optical waveguide were locally changed. Thus, the part of the optical waveguide lying under the triangular gate electrode 5 is capable of charge-storage, and at the same time the underlying part is capable of changing the light path, depending on whether the underlying part stores electrons or not. Consequently, the triangular gate electrode 5 functions as a plane prism, and the path of the guided light after passing the plane prism depends on whether or not electrons have been injected and stored. In FIG. 6, a prism coupler 10 is used for feeding the light 11 into the optical waveguide 3 from the exterior.

If avalanche process is used rather than ultraviolet ray to inject electrons, it is not necessary to make the triangular gate electrode of a completely transparent material, and a triangular gate be made of a material less permeable to light is sufficient. A triangular floating gate may be formed by building in a part of the Ta$_2$O$_5$ as shown in FIGS. 4 and 5.

In FIG. 6, the gate constitutes a plane prism. However, whatever shape of the gate may be, if the guided light is taken out from midway in the gate plane, the mode of the wave taken out is modulated whether or not electrons have been injected and stored in the electron storing means under the gate plane, because the phase condition of the guided light under the gate is influenced by the trapped electrons. The embodiment above mentioned uses a Ta$_2$O$_5$ optical waveguide, but it should be noted that the optical waveguide may be of Al$_2$O$_3$.

Figure 7:
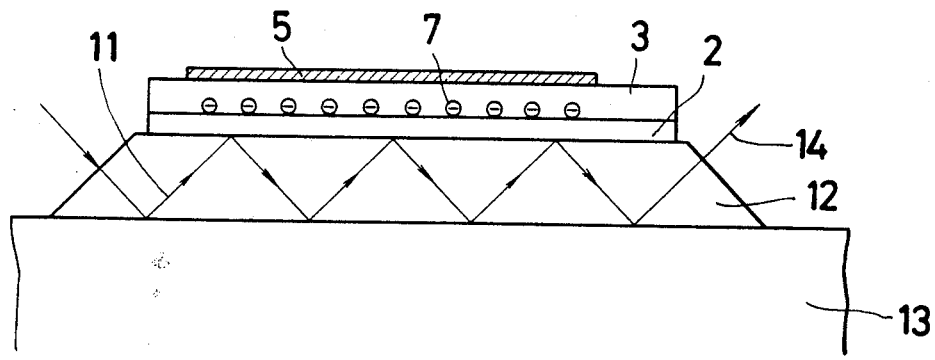
FIG. 7 shows the manner in which the guided light propagates in the semiconductor substrate per se.

FIG. 7 shows an embodiment using a semiconductor film 12 as an optical waveguide. The semiconductor film such as an Si film is formed by epitaxial-growing on a sapphire substrate 13. An SiO$_2$ layer 2 is formed on the semiconductor film, and a Ta$_2$O$_5$ layer 3 is deposited on the SiO$_2$ layer 2, and finally electrodes 5 are fixed to the Ta$_2$O$_5$ layer. In this case the wave length of the guided light must be longer than the wave length which corresponds to the band gap energy of the semiconductor film. The index of refraction of the semiconductor film is large, compared with those of the materials of the adjacent parts, and therefore the semiconductor film can be used as an optical waveguide.

When the guided light reaches the part of the waveguide where electrons 7 are stored, the guided light is influenced through the interaction between the evanescent wave and the stored charges and also interacts with the locally generated surface semiconductor charges due to the stored charges. Therefore, the phase and/or amplitude of the light 14 leaving the optical waveguide is modulated. The structure of the device as shown in FIG. 7 can be easily made by using the SOS (Silicon On Sapphire) substrate which has been developed recently. The index of refraction of Si is large compared with those of the other layers, and therefore the Si layer does not leak the guided light. Therefore, the SiO$_2$ layer may be omitted, and an insulating film having electronic charge-storing means may be laid directly on the Si film.

Figure 8:
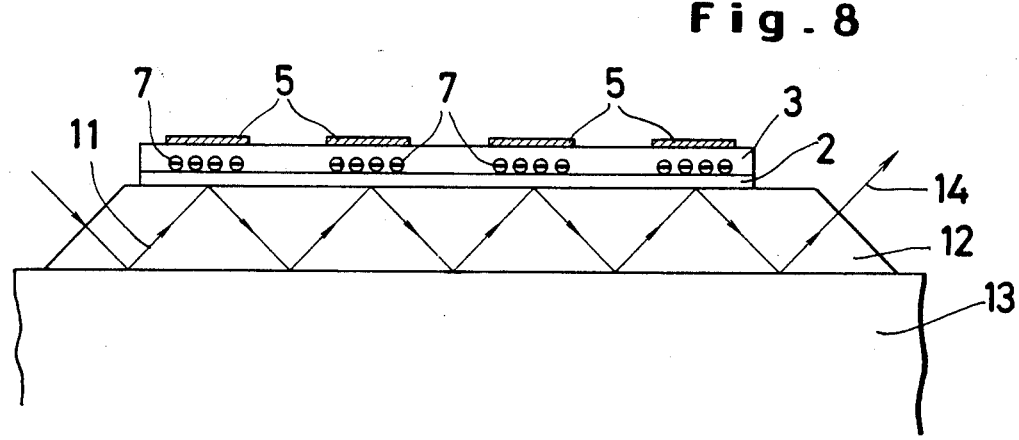
FIG. 8 shows still another embodiment of this invention using the semiconductor substrate per se as the waveguide with several discrete gates periodically aligned.

FIG. 8 shows an embodiment wherein the discrete gate electrodes 5 on the Ta$_2$O$_5$ film 3 are aligned periodically. The guided light 11 propagating in the semiconductor film is modulated by the interaction between the guided light and the stored electrons as explained in connection with FIG. 7. However, guided light whose mode gives it a zig-zag path having a pitch matched with the period of the gate electrodes undergoes greater interaction with the stored electrons than do guided waves with other modes. Thus, the optoelectronic device with the structure as shown in FIG. 8 functions as a mode selective, optical modulator.

As is apparent from the above, the first feature of this invention is to perform the storing and erasing of memory in a semiconductor device by means of the light guided in the longitudinal direction of the device. The second feature of this invention is to change the light mode under the influence of electronic charges locally stored in the optical waveguide, thus realizing an optical modulating element. The third feature of this invention is to provide a similar modulator for the guided light by attaching a layer having electronic charge-storing means to the optical waveguide.

According to this invention an active optoelectronic semiconductor device can be produced using IC technology, and an optical device and a semiconductor device can easily be combined with each other. This is most advantageous to the production of optical information processing devices in the form of integrated circuits.

What is claimed is:
1. An optoelectronic semiconductor device comprising:
   a semiconductor substrate;
   a first insulating layer covering the major surface of said semiconductor substrate;
   a second insulating layer of Ta$_2$O$_5$ lying on said first insulating layer, said second insulating layer having a higher refractive index than said first insulating layer and constituting an optical waveguide together therewith;
   an electrode provided at a desired position on said second insulating layer;
   charge-storing means in said second insulating layer below said electrode for storing electric charge as nonvolatilizably memorized information;
   whereby portions of said second insulating layer other than the portion positioned under said electrode are capable of transmitting without substantial loss coherent guided light having an energy lower than that corresponding to the energy band gap of said second insulating layer, and an interaction is caused between the electric charge stored by said charge-storing means and said guided light passing therethrough, said interaction causing a change of the state of electric charge stored by said charge-storing means and causing said light to be modulated by absorption and phase change.

2. An optoelectronic semiconductor device according to claim 1, wherein said electrode is transparent, so that electric charge can be injected into said charge-storing means by applying incident light and a voltage to said electrode.

3. An optoelectronic semiconductor device according to claim 1 wherein said device is adapted to allow the guided light to be taken from the midsection of said electrode.

4. An optoelectronic semiconductor device comprising:
   a semiconductor substrate;
   a first insulating layer covering the major surface of said semiconductor substrate;
   a second insulating layer lying on said first insulating layer, said second insulating layer having a higher refractive index than said first insulating layer and constituting an optical waveguide together therewith;
   an electrode provided at a desired position on said second insulating layer; and
   a floating gate of electrically conductive material in said second insulating layer below said electrode for storing electric charge as nonvolatilizably memorized information;
   whereby portions of said second insulating layer other than the portion positioned under said electrode are capable of transmitting without substantial loss coherent guided light having an energy lower than that corresponding to the energy band gap of said second insulating layer, and an interaction is caused between the electric charge stored by said floating gate and said guided light passing therethrough, said interaction causing a change of the state of the electric charge stored by said charge-storing means and causing said light to be modulated by absorption and phase change.

5. An optoelectronic semiconductor device comprising: a semiconductor substrate;
   a first insulating layer covering the major surface of said semiconductor substrate;
   a second insulating layer lying on said first insulating layer, said second insulating layer having a higher refractive index than said first insulating layer and constituting an optical waveguide together therewith;
   an electrode provided at a desired position on said second insulating layer; and,
   a floating gate of transparent electrically conductive material forming a segment of said optical waveguide below said electrode for storing electric charge as nonvolatilizably memorized information.

6. An optoelectronic semiconductor device comprising:
   a semiconductor substrate;
   a first insulating layer covering the major surface of said semiconductor substrate;
   a second insulating layer lying on said first insulating layer, said second insulating layer having a higher refractive index than said first insulating layer and constituting an optical waveguide together therewith;

an electrode formed in the shape of a triangle and provided at a desired position on said second insulating layer;

charge-storing means formed in the shape of a triangle in said second insulating layer below said electrode for storing electric charge as nonvolatilizable memorized information, whereby said charge-storing means causes light guided therethrough to be deflected by the absorption effect and the phase-change effect by interaction between the guided light and the charge in said charge-storing means.

7. An optoelectronic semiconductor device according to claim 6, wherein said charge-storing means is at least one floating gate of electrically conductive material.

8. An optoelectronic semiconductor device according to claim 6, wherein said charge-storing means is a floating gate of transparent electrically conductive material forming a segment of said optical waveguide.

9. An optoelectronic semiconductor device comprising:
a substrate;
a semiconductor layer covering the surface of said substrate, said semiconductor layer having a higher refractive index than said substrate, and constituting an optical waveguide together therewith;
a first insulating layer covering the major surface of said semiconductor layer and having a lower refractive index than said semiconductor layer;
a second insulating layer lying on said first insulating layer;
an electrode provided at a desired position on said second insulating layer;
charge-storing means in said second insulating layer below said electrode for storing electric charge as nonvolatilizably memorized information;
whereby portions of said semiconductor layer other than the portion positioned under said electrode are capable of transmitting without substantial loss coherent guided light having an energy lower than that corresponding to the energy band gap thereof, and an interaction is caused by exciting the charge stored by said charge-storing means by an evanescent wave of said guided light through said first insulating layer, and an interaction is caused between said guided light and induced charges at the surface of said semiconductor layer by the charge stored by said charge-storing means, causing said guided light to be modulated by absorption and phase change.

10. An optoelectronic semiconductor device according to claim 9, wherein said semiconductor layer is an epitaxial film grown on said substrate.

11. An optoelectronic semiconductor device according to claim 9 wherein said charge-storing means and said electrode are each formed in the shape of a triangle, so that an interaction between said guided light and charge stored in said charge-storing means causes absorption and phase change of the guided light.

12. An optoelectronic semiconductor device comprising:
a substrate;
a semiconductor layer covering the surface of said substrate, said semiconductor layer having a higher refractive index than said substrate, and constituting an optical waveguide together therewith;
a first insulating layer covering the major surface of said semiconductor layer and having a lower refractive index than said semiconductor layer;
a second insulating layer lying on said first insulating layer;
charge-storing means in said second insulating layer for storing electric charge as nonvolatilizably memorized information; and
a plurality of electrodes aligned periodically on said second insulating layer and having a period matched to the pitch of a guided optical wave of one mode to enhance the interaction of said guided optical wave with the charge stored by said charge-storing means relative to that of guided waves of other modes, whereby a mode-selective optical modulator function is obtained.

* * * * *